US008653722B2

(12) United States Patent
Mizusawa

(10) Patent No.: US 8,653,722 B2
(45) Date of Patent: Feb. 18, 2014

(54) AT-CUT QUARTZ-CRYSTAL DEVICE AND METHODS FOR MANUFACTURING SAME

(75) Inventor: Shuichi Mizusawa, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 286 days.

(21) Appl. No.: 13/195,439

(22) Filed: Aug. 1, 2011

(65) Prior Publication Data

US 2012/0032562 A1   Feb. 9, 2012

(30) Foreign Application Priority Data

Aug. 4, 2010   (JP) .................................. 2010-175321

(51) Int. Cl.
*H01L 41/053* (2006.01)
*H01L 41/16* (2006.01)
*C03B 19/00* (2006.01)

(52) U.S. Cl.
USPC ........... 310/361; 310/340; 310/348; 310/360; 29/25.35; 117/63; 117/72; 117/902

(58) Field of Classification Search
USPC ........ 310/340, 48, 360; 29/25.35; 117/63, 71, 117/72, 902
See application file for complete search history.

(56) References Cited

U.S. PATENT DOCUMENTS

| 8,227,958 B2* | 7/2012 | Inoue et al. .................. 310/344 |
| 2011/0234052 A1* | 9/2011 | Amano et al. ................ 310/344 |
| 2012/0032561 A1* | 2/2012 | Mizusawa et al. ........... 310/344 |
| 2012/0074876 A1* | 3/2012 | Redler ............................. 318/41 |
| 2012/0169182 A1* | 7/2012 | Mizusawa et al. ........... 310/348 |
| 2012/0200198 A1* | 8/2012 | Yamamoto .................... 310/348 |

FOREIGN PATENT DOCUMENTS

| JP | 2003-017607 | * 1/2003 | ............. H01L 23/02 |
| JP | 2004-328028 A | 11/2004 | |

* cited by examiner

*Primary Examiner* — Thomas Dougherty
(74) *Attorney, Agent, or Firm* — Alix, Yale & Ristas, LLP

(57) ABSTRACT

The present disclosure provides a manufacturing method of a quartz-crystal device, in which its lid and base is manufactured with smaller thermal expansion coefficient between AT-cut quartz-crystal wafer. The method for manufacturing a quartz-crystal device comprises the steps of: preparing an AT-cut quartz-crystal wafer (70) having a plurality of frames, the frame includes an AT-cut vibrating piece having a first principal surface and an second principal surface, and an outer frame which surrounds the AT-cut vibrating piece for supporting the AT-cut frame; preparing a lid wafer (60) having a plurality of a lids; preparing a quartz-crystal base wafer (80) including a plurality of a base; and bonding the AT-cut quartz-crystal wafer, the quartz-crystal base wafer and the quartz-crystal lid wafer; wherein size of the AT-cut quartz-crystal wafer, the quartz-crystal base wafer and the quartz-crystal lid wafer are between three to four inches; and the quartz-crystal base wafer and the quartz-crystal lid wafer are cut at an angle between 24°00' or more and 32°28' or less from crystallographic Z-axis.

12 Claims, 6 Drawing Sheets

AT-CUT QUARTZ-CRYSTAL DEVICE AND METHODS FOR MANUFACTURING SAME

CROSS-REFERENCE TO RELATED APPLICATION

This application claims priority to and the benefit of Japan Patent Application No. 2010-175321, filed on Aug. 4, 2010, in the Japan Patent Office, the disclosures of which are incorporated herein by reference in their respective entireties.

FIELD

The present disclosure relates to an AT-cut quartz-crystal device in which the AT-cut quartz-crystal vibrating device is sandwiched between the lid and base thereof. The present disclosure relates to manufacturing method thereof.

DESCRIPTION OF THE RELATED ART

Conventionally, the quartz-crystal wafer, the base wafer and the lid wafer are bonded together, in order to mass-produce an individual AT-cut quartz-crystal piece. For example, Japan Unexamined Patent Publication No. 2004-328028 discusses using a quartz-crystal material for the base wafer and the lid wafer, in order to dissipate an internal stress generated on the AT-cut quartz-crystal piece while the base wafer and lid wafer are being bonded by adhesive. Japan Unexamined Patent Publication No. 2004-328028 also discloses an AT-cut quartz-crystal device having a groove portion surrounding the AT-cut quartz-crystal piece, in order to reduce the thermal expansion.

However, Japan Unexamined Patent Publication No. 2004-328028 does not disclose or suggest the specific cut of the quartz-crystal material used for the base wafer and lid wafer.

In this present disclosure, the number of the quartz-crystal devices fabricated from the synthetic quartz-crystal increases, and also minimizes the thermal coefficient expansion.

SUMMARY

A first aspect of the present disclosure is directed to method for manufacturing a quartz-crystal device. The manufacturing method of the quartz-crystal device comprises a step of preparing an AT-cut quartz-crystal wafer having a plurality of frames, each frame including an AT-cut vibrating piece having a first principal surface and a second principal surface, and an outer frame which surrounds the AT-cut vibrating piece for supporting the AT-cut frame thereof; a step of preparing a lid wafer having a plurality of a lid having a first surface for bonding to the principal surface of an outer frame; a step of preparing a quartz-crystal base wafer including a plurality of a base having a second surface for bonding to the second principal surface of the outer frame; and a step of bonding the AT-cut quartz-crystal wafer, the quartz-crystal base wafer and the quartz-crystal lid wafer. The respective AT-cut quartz-crystal wafer, the quartz-crystal base wafer and the quartz-crystal lid wafer are in a size between three to four inches. And during the preparing steps, the quartz-crystal base wafer and the quartz-crystal lid wafer are cut at an angle between 24°00' or more and 32°28' or less from crystallographic Z-axis.

A second aspect of the present disclosure is directed to method for manufacturing a quartz-crystal device. During the bonding step of the method for manufacturing the quartz-crystal device of its first aspect, a method for bonding by a sealing material or a siloxane bonding is used, the method for bonding by a sealing material includes applying the sealing material onto the first principal surface of the outer frame and the first surface of the lid, and applying the sealing material onto the second principal surface of the outer frame and the second surface of the base, and wherein the bonding step by siloxane bonding includes the bonding by activating the first surface of the lid and the second surface of the base for siloxane bonding.

A third aspect of the present disclosure is directed to a method for manufacturing a quartz-crystal device. In its third aspect, the sealing material comprises an adhesive made of epoxy resin, eutectic metal or polyimide resin.

A fourth aspect of the present disclosure is directed to a quartz-crystal device. The piezoelectric device comprises: an AT-cut frame including an AT-cut vibrating piece having a pair of an excitation electrode formed on a first principal surface and a second principal surface, and an AT-cut frame having an outer frame for surrounding the AT-cut vibrating piece; a quartz-crystal lid having a first surface that is bonded to the principal surface of the outer frame; and a quartz-crystal base having a second surface that is bonded to the second principal surface of the outer frame; wherein the quartz-crystal base and the quartz-crystal lid are cut at an angle between 24°00' or more and 32°28' or less from crystallographic Z-axis.

A fifth aspect of the present disclosure is directed to a quartz-crystal device. In its fifth aspect, the sealing materials are disposed between the principal surface of the outer frame and the first surface, and between the second principal surface of the outer frame and the second surface.

A sixth aspect of the present disclosure is directed to a quartz-crystal device. In its sixth aspect, the principal surface of the outer frame and the first surface of the lid, and the second principal surface of the outer frame and the second surface of the base are activated and bonded by siloxane bonding.

A seventh aspect of the present disclosure is directed to a quartz-crystal device. In its seventh aspect, a castellation is formed on periphery of the outer frame, the periphery is defined by looking from the first principal surface to the second principal surface of the outer frame.

According to the present disclosure, the quartz-crystal devices are provided that exhibit smaller thermal expansion coefficient between the AT-cut quartz-crystal wafer and the lid and base, and further provides the quartz-crystal devices that can produce more quartz-crystal device. The present disclosure provides the manufacturing method thereof.

DETAILED DESCRIPTION

Various representative embodiments are described below with reference to the respective drawings. It will be understood that the scope of the disclosure is not limited to the described embodiments, unless otherwise stated.

First Embodiment

<Overall Configuration of the First Quartz-Crystal Device 100>

Figure 1A:
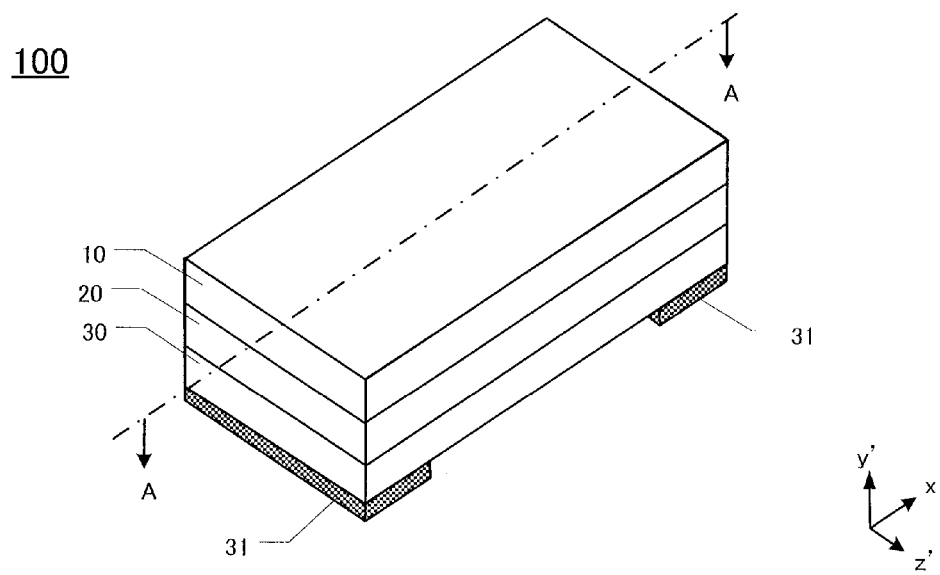
FIG. 1A is a perspective view of the quartz-crystal device 100.

A configuration of the quartz-crystal device of the present disclosure is explained using FIG. 1 as a reference. FIG. 1A is a perspective view of the quartz-crystal device 100. The quartz-crystal device 100 is constituted of the quartz-crystal lid 10, quartz-crystal base 30 and AT-cut frame 20. The quartz-crystal device 100 is configured such that the quartz-crystal lid 10 constitutes an upper portion, the quartz-crystal base 30 constitutes a lower portion and the AT-cut frame 20 is sandwiched between the quartz-crystal lid 10 and the quartz-crystal base 30. External electrodes 31 are formed on the lower main surface of the quartz-crystal base 30.

AT-cut frame 20, which is fabricated from AT-cut quartz-crystal vibrating piece, has a first principal surface that is tilted, with respect to the Y-axis of the crystallographic axes (XYZ), from the Z-axis to the Y-axis direction by 35°15′, with X-axis as a center of reference. Therefore, the quartz-crystal device 100 is described below by designating a longitudinal direction thereof as the x-axis direction, y'-axis direction and z'-axis direction. In this explanation below, inclination to the y'-axis is denoted as +y'-axis and declination to the y'-axis is denoted as -y'-axis.

Also, the quartz-crystal lid 10 and quartz-crystal base 30 are cut with respect to Z-axis direction by 24°00′ or more and 32°28′ or less. Although the axial direction of the AT-cut quartz-crystal vibrating piece differs, the axial direction of the quartz-crystal lid 10 and the quartz-crystal base 30 is referred as x-axis direction, y'-axis direction and z'-axis direction.

Figure 1B:
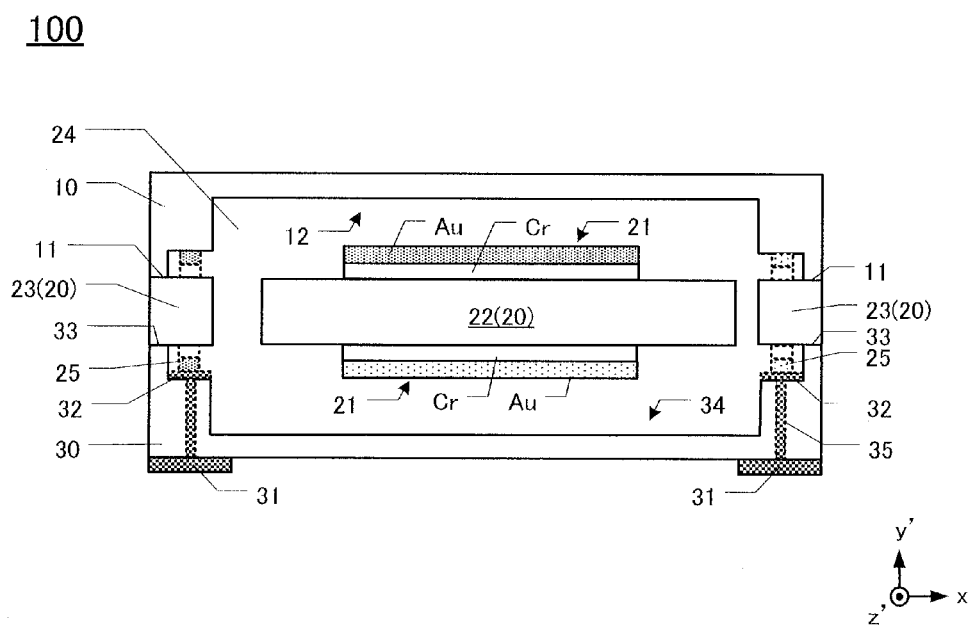
FIG. 1B is a cross-sectional view of the quartz-crystal device of FIG. 1A taken along A-A line.

FIG. 1B is a cross sectional view of FIG. 1A taken along A-A line. AT-cut frame 20 is constituted of an AT-cut vibrating piece 22 on which excitation electrodes 21 are formed on respective first principal surface and the second principal surface, and an outer frame for surrounding the AT-cut vibrating piece 22. When voltage is applied to a pair of the excitation electrodes 21, the AT-cut vibrating piece 22 vibrates at a predetermined vpm. By referring the principal surface as a surface on +y'-axis and the second principal surface as a surface on -y'-axis, the quartz-crystal lid 10 bonds to the first principal surface on the outer frame 23, and the quartz-crystal base 30 bonds to the second principal surface on the outer frame 23. The quartz-crystal lid 10 bonds to the outer frame 23 through the first surface 11 formed on the -y'-axis direction of the quartz-crystal lid 10, and the quartz-crystal lid 30 bonds to the outer frame 23 through the second surface 33 formed on the +y'-axis direction of the quartz-crystal lid 10.

A recess 12 is situated on center of the -y'-axis side surface of the quartz-crystal lid 10. Also, a recess 34 is situated on center of the +y'-axis side surface of the quartz-crystal base 30. AT-cut vibrating piece 22 of the AT-cut frame 20 is situated in a cavity 24 defined by the recess of the quartz-crystal lid 10 and the recess of the quartz-crystal base 30.

The connection electrodes 32 are formed on second surface of the quartz-crystal base 30, and the external electrodes 31 are formed on lower main surface of the quartz-crystal base 30. Connection electrodes 32 are electrically connected to respective external electrodes 31 through the conductor 35 inside the quartz-crystal base 30.

Respective excitation electrodes 21 are formed on the AT-cut vibrating piece of the AT-cut frame 20, and corresponding extraction electrodes 25 are formed on the outer frame 23. The excitation electrodes 21 are electrically connected to respective extraction electrodes 25. Thus, the excitation electrodes 21 are electrically connected to the respective extraction electrodes 25. Each electrodes on the AT-cut frame 20 are constituted of the first layer of chromium (Cr), followed by a second layer of gold (Au).

Figure 2A:
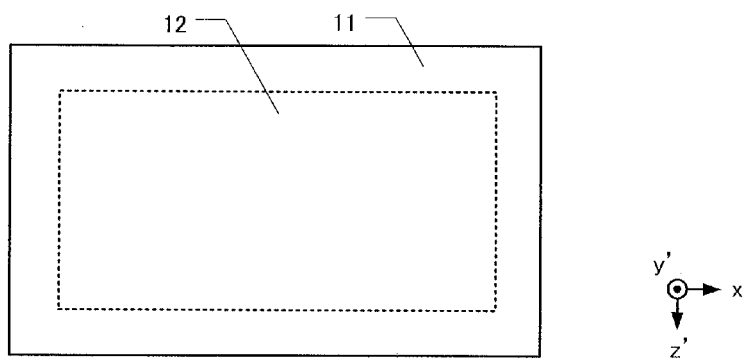
FIG. 2A is a plan view of a quartz-crystal lid 10.

FIG. 2A is a plan view of the quartz-crystal lid 10. The quartz-crystal lid 10 has a rectangular principal surface that extends longitudinally in x-axis direction and with shorter sides extending in the z'-axis direction. On the outer periphery of the -y'-axis side surface, the first surface 11 is formed for connecting to outer frame 23 of the AT-cut frame 20, and a recess 12 is surrounded by the first surface 11.

Figure 2B:
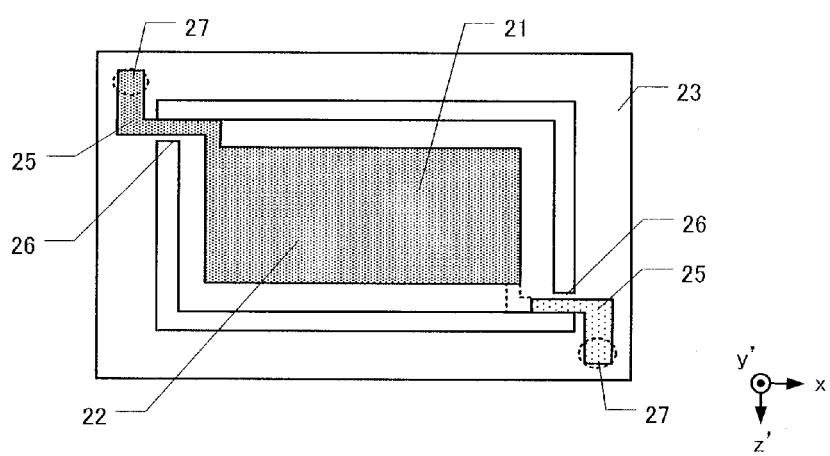
FIG. 2B is a plan view of an AT-cut frame 20.

FIG. 2B is a plan view of the AT-cut frame 20. AT-cut vibrating piece 22 and the outer frame 23 are connected together by connection arms 26. The extraction electrodes 25 extending from respective excitation electrodes 21 extend over the connection arms 26 to respective corner of the outer frame 23. The extraction electrodes 25 are connected to respective connection electrodes 32 situated on the quartz-crystal base 30 at the respective junction 27 situated at corners of the outer frame 23. The junction 27 is situated on -y'-axis side surface, which is indicated with dotted circle in FIG. 2B. Also, in FIG. 2B, the excitation electrodes 21 situated on +y'-axis side surface and extraction electrodes 25 connected to respective excitation electrodes 21 are colored with dark color, and the excitation electrodes 21 situated on -y'-axis side surface and extraction electrodes 25 connected to respective excitation electrodes 21 are colored with lighter color. The extraction electrodes 25 connected to respective excitation electrodes 21 situated on the -y'-axis side surface are extended to the +y'-axis side and situated on the outer frame 23.

Figure 2C:
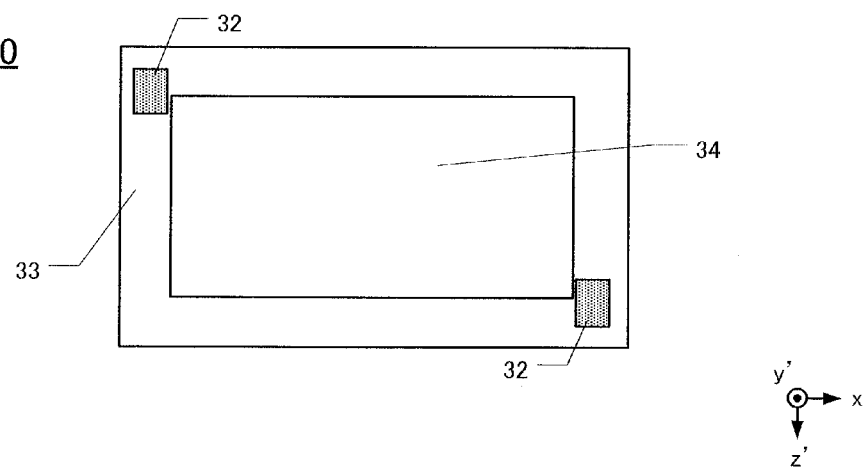
FIG. 2C is a plan view of the quartz-crystal base 30.

FIG. 2C is a plan view of the quartz-crystal base 30. On the outer periphery of the quartz-crystal base 30 in +y'-axis side surface, a second surface 33 is formed for bonding to the outer frame 23 of the AT-cut frame 20, and a recess 34 is formed inside the second surface 33. On a part of the second surface 33 of the quartz-crystal base 30 on the +y'-axis side surface, a connection electrodes 32 are formed for electrically connecting respective junction 27 of the extraction electrodes 25 of the AT-cut frame 20.

The quartz-crystal lid 10, AT-cut frame 20 and quartz-crystal base 30 are all fabricated from quartz-crystal lid wafer 60, AT-cut wafer 70 and quartz-crystal base wafer 80 fabricated from synthetic quartz-crystal 50. Hereinafter, cutting directions of the synthetic quartz-crystal 50 for fabricating respective quartz-crystal lid wafer 60, AT-cut quartz-crystal wafer 70 and quartz-crystal base wafer 80, are explained.

Figure 3A:
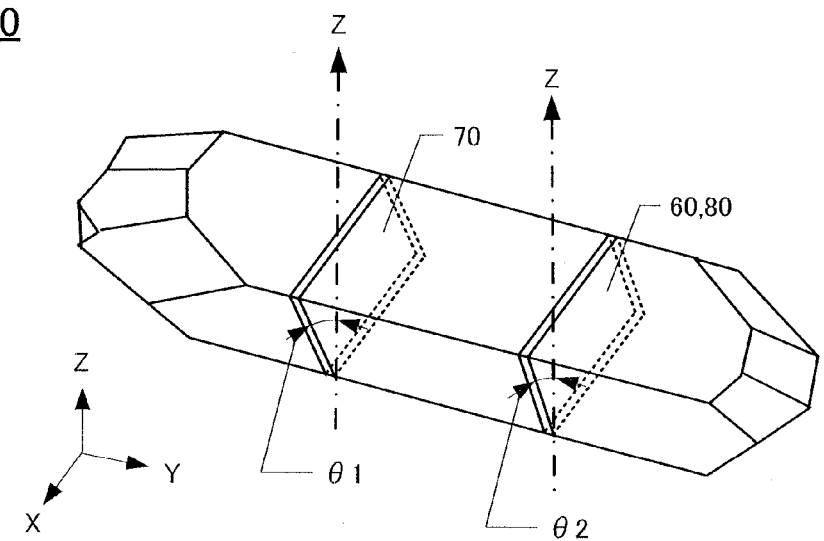
FIG. 3A is a perspective view of the synthetic quartz-crystal 50.

FIG. 3A is a perspective view of the synthetic quartz-crystal 50. In this specification, cut synthetic quartz crystal is referred as synthetic quartz-crystal 50. The X-axis, Y-axis and Z-axis of crystallographic axis of quartz-crystal has a different meaning from x-axis, y'-axis and z'-axis indicated for explaining the quartz-crystal device 100. AT-cut quartz-crystal wafer 70 for fabricating AT-cut frame 20 is cut from the synthetic quartz-crystal in parallel direction to X-axis and at θ1 angle from Z-axis, and quartz-crystal lid wafer 60 and quartz-crystal base wafer 80 are lumbered from the synthetic quartz-crystal in parallel direction to X-axis direction and at θ1 angle from Z-axis. θ1 angle equals to 35°15', off by several minutes. Also, in the quartz-crystal device 100, θ2 angle is between 24°00' or more and 32°28' or less. In FIG. 3A, AT-cut quartz-crystal wafer 70, quartz-crystal lid wafer 60 and quartz-crystal base wafer 80 are all denoted on the same synthetic quartz-crystal 50. However, in actual practice, an AT-cut quartz-crystal wafer 70 is lumbered from one synthetic quartz-crystal 50, or a combination of a quartz-crystal lid wafer 69 and a quartz-crystal base wafer 80 are lumbered from one synthetic quartz-crystal wafer 50. The quartz-crystal wafer 80 and quartz-crystal base wafer 80 can be lumbered from the same quartz-crystal base wafer 80.

Figure 3B:
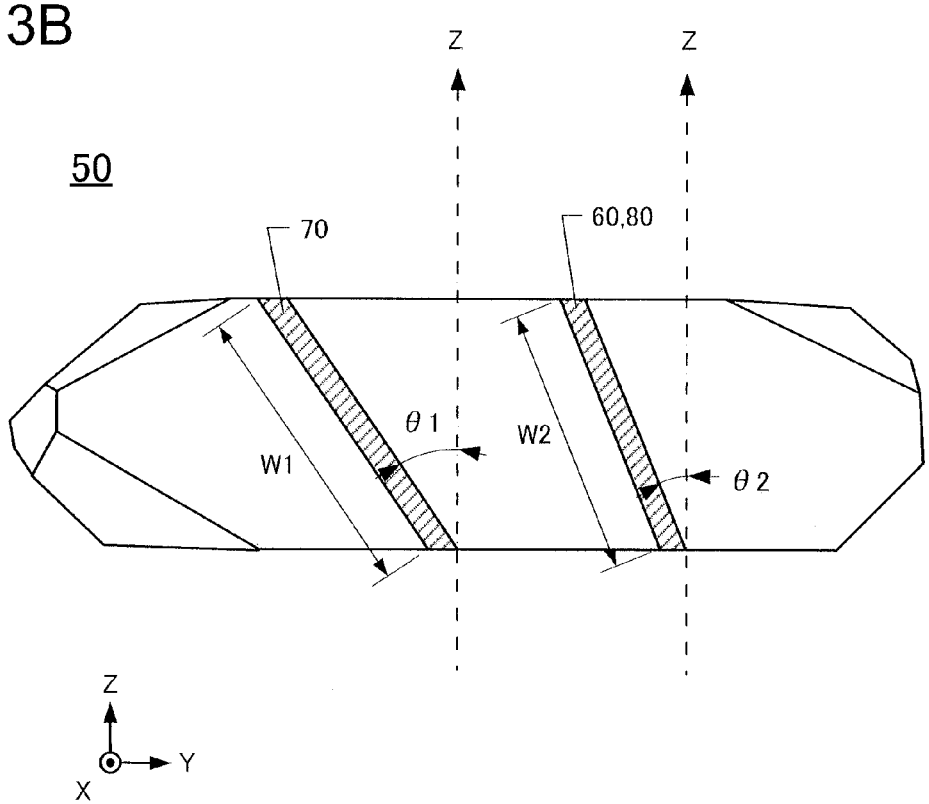
FIG. 3B is a plan view of the synthetic quartz-crystal 50 taken along +X-axis direction.

FIG. 3B is a plan view of the synthetic quartz-crystal 50 viewed from +X-axis direction. When AT-cut quartz-crystal wafer 70 is lumbered from the synthetic quartz-crystal 50 at angle θ1, length of the side W1 vertical to X-axis direction of the AT-cut quartz-crystal wafer 70 is longer than 4 inches. Also, when quartz-crystal lid wafer and AT-cut quartz-crystal wafer 80 is lumbered from the synthetic quartz-crystal 50 at angle θ2, length of the side W2 vertical to X-axis direction of the quartz-crystal lid wafer 60 and the quartz-crystal base wafer 80 are longer than 4 inches.

<Angle for Lumbering the Quartz-Crystal Lid Wafer 60 and Quartz-Crystal Base Wafer 80>

The angle θ2 for lumbering the quartz-crystal lid wafer 60 and quartz-crystal base wafer 80 from the synthetic quartz-crystal 50 is considered with respect to the linear expansion coefficient (coefficient of thermal expansion) from the AT-cut quartz-crystal wafer 70, and number of wafers that can be produced from one synthetic quartz-crystal 50. Hereinafter, a method for determining the angle θ2 is explained.

The quartz-crystal device 100 is disposed for use in automobiles and electric appliances, wherein the temperatures of such appliances range between −30° C. and 80° C. When the linear expansion coefficient differs between the quartz-crystal lid 10, quartz-crystal base 30 and AT-cut frame 20, relative connecting surfaces may peel due to thermal change or the quartz-crystal device 100 may break. In this embodiment, quartz-crystal device 100 is manufactured per wafer (refer to FIG. 4). Therefore, if the difference in linear expansion coefficient among quartz-crystal wafer, quartz-crystal base wafer and AT-cut quartz-crystal wafer are large, each wafer may curve while bonding each wafer, causing damage and curve, thus leading to degradation of the quartz-crystal device. Therefore, it is preferred that the quartz-crystal lid wafer 60, the quartz-crystal base wafer 80 and AT-cut quartz-crystal wafer 70 are all taken at relatively close linear expansion coefficient.

If the quartz-crystal lid wafer 60 and quartz-crystal base wafer 80 are lumbered by AT-cut, it produces the same linear expansion coefficient as the AT-cut quartz-crystal wafer 70, thus prevents damage due to thermal change. However, this limits the number of AT-cut quartz-crystal wafer lumbered from the synthetic quartz-crystal 50, thus increasing the manufacturing cost. Therefore, whenever the quartz-crystal is used on the lid or base, Z-cut quartz-crystal wafer (wherein the angle θ2 is 90 degrees) is mainly used. However, when the Z-cut quartz-crystal wafer is used for quartz-crystal lid wafer 60 and quartz-crystal base wafer 80, the difference in linear expansion coefficient caused degradation in quartz-crystal device 100.

Therefore, the object of this embodiment is to determine the angle for lumbering quartz-crystal lid wafer 60 and quartz-crystal base wafer 80, wherein the linear expansion coefficient is nearly as same value as the linear expansion coefficient of the AT-cut quartz-crystal wafer 70. The linear expansion coefficient is a value which indicates the changing ratio in relation to rising in temperature. Thus, the coefficient can be identified in a following equation:

$$\Delta L = \alpha \cdot L \cdot \Delta T \quad (1)$$

Wherein, L is length, ΔL is change in the length, ΔT is rise in temperature and α is linear expansion coefficient. In the quartz-crystal device 100, AT-cut quartz-crystal wafer 70, quartz-crystal lid wafer 60 and quartz-crystal base wafer 80 are all lumbered from the synthetic quartz-crystal 50 in parallel to x-axis direction, thus producing the same linear expansion coefficient. Therefore, the only issue remains in the linear expansion coefficient in z'-axis direction.

The linear expansion coefficient of the AT-cut quartz-crystal wafer 70 is 8.6 ppm/° C. in z'-axis direction. The difference between the linear expansion coefficient for the lid and base and the AT-cut quartz-crystal wafer 70 is preferred to be within ±1.0 ppm/° C. Therefore, it is preferred that the linear expansion coefficient of the lid and base is between 7.6 ppm/° C. to 9.6 ppm/° C.

The value of ±1.0 ppm/° C. was resulted by performing thermal-shock test on the crystal-quartz device. In other words, the value was resulted by repeatedly applying the thermal change ranging −30° C. to 80° C. onto the quartz-crystal device manufactured by bonding the lid and base having different thermal expansion coefficient than the AT-cut frame 20, and determining the number of quartz-crystal devices damaged from the test.

The linear expansion coefficient in z'-axis direction can be calculated using the following equation:

$$\alpha_{z'} = Ay \times \sin^2\theta + Az \times \cos^2\theta \quad (2)$$

Wherein, $\alpha_{z'}$ is a linear expansion coefficient in z'-axis direction, Ay is a linear expansion coefficient in Y-axis direction (12.2 ppm/° C.), Az is a linear expansion coefficient in Z-axis direction (6.8 ppm/° C.) and θ is an angle between Z-axis and z'-axis.

According to equation (2), when the linear expansion coefficient in z'-axis direction is 7.6 ppm/° C., angle θ is 23°00'. In order to produce as many wafers as possible, it is preferred that angle θ2 is less than 35°15'. Therefore, value of the linear expansion coefficient over 8.6 ppm/° C. is not preferred, since the θ will be over 35°15'. In accordance the linear expansion coefficient, the angle θ2 is preferred to be more than 23°00' and less than 35°15'.

On the other hand, in order to obtain as many quartz-crystal lid wafers 60 and quartz-crystal base wafers 80 from one synthetic quartz-crystal 50, the angle θ2 is preferred to be at 0°. However, in order to adjust to the size of AT-cut quartz-crystal wafer 70, which is 4-inches, the length W2 of the quartz-crystal lid wafer 60 and quartz-crystal base wafer 80 is at least four inches. In order to make the length W2 of the quartz-crystal lid wafer 60 and quartz-crystal base wafer 80 in more than four inches and obtain the maximum number of the wafer from the synthetic crystal, it is preferred that the angle θ2 be 24°00' or more.

The synthetic quartz-crystal is manufactured using an autoclave, a high-temperature and high-humidity container. The synthetic quartz-crystal of four inches, manufactured in an autoclave, has predetermined size, due to the direction of crystallization.

Therefore, considering the linear expansion coefficient in z'-axis direction and that length of the wafer W2 is at least four inches, it is preferred that the angle θ2 be between 24°00' and 35°15'. Also, considering the increase in the number of the wafers that can be acquired by making the angle θ2 smaller, and the linear expansion coefficient between the AT-cut quartz-crystal wafer 70 decreases as the angle θ2 reaches closer to 35°15', it is preferred that the angle θ2 is 31°58'±30'. When the angle θ2 is 32°28', the coefficient in thermal expansion in z'-axis direction is 8.3 ppm/° C. Also, when the angle θ2 is 31°28', the coefficient in thermal expansion in z'-axis direction is 8.27 ppm/° C. Accordingly, the linear expansion coefficient of the AT-cut quartz-crystal wafer 70 is 8.6 ppm/° C. to −0.24 ppm/° C. to −0.33 ppm/° C., thus minimizing the difference from the linear expansion coefficient of the AT-cut quartz-crystal wafer 70. Although the preferred angle θ2 is 31°58'±30', it can be used even if the angle θ2 is smaller, and a smaller angle provides more wafers that can be acquired. Therefore, the preferred angle θ2 is between 24°00' or more and 32°28' or less. Also, the result above can be used for wafer of three inches or more, instead of four inches.

<Manufacturing the Quartz-Crystal Device 100>

Figure 4:
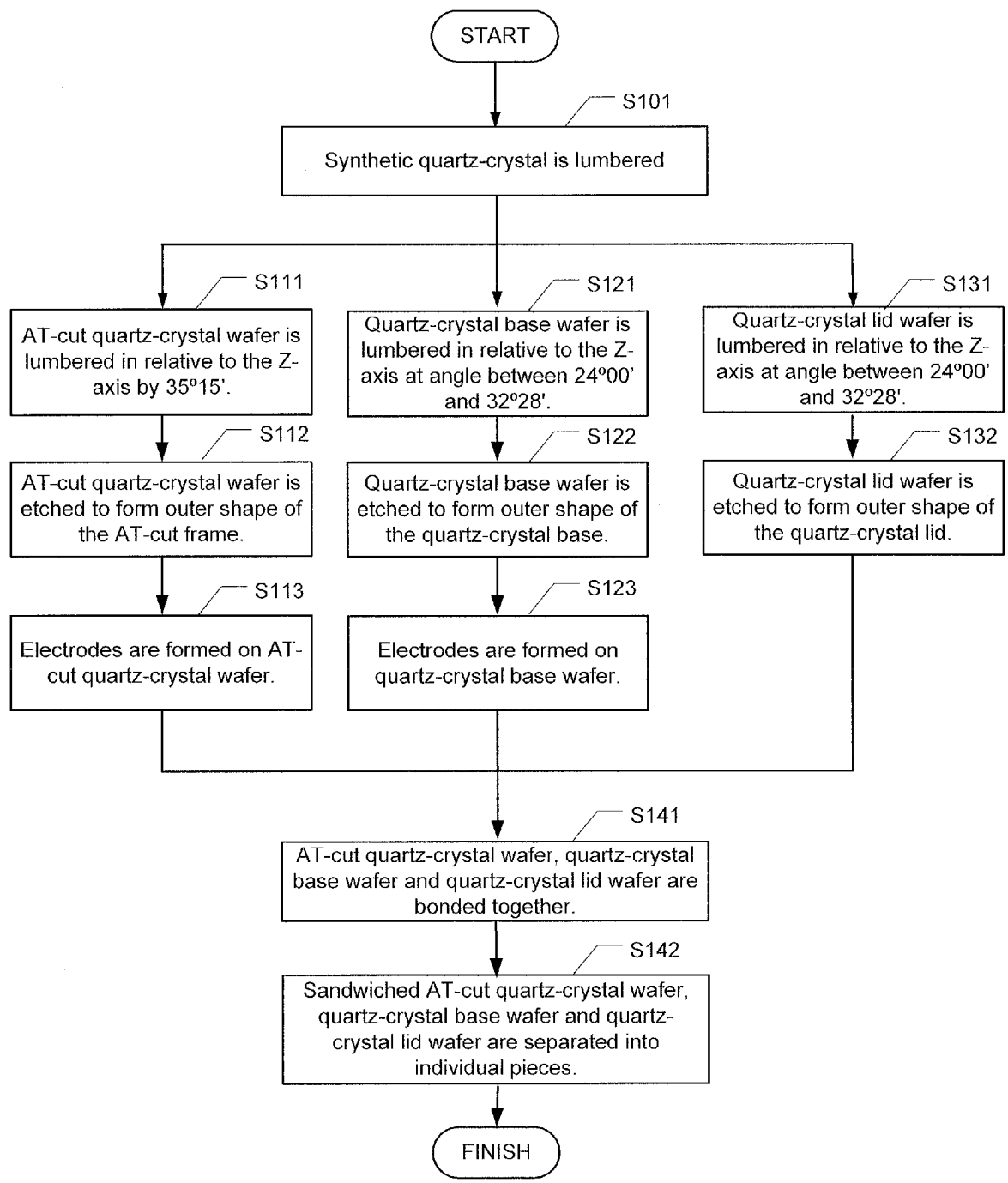
FIG. 4 is a flow chart showing the manufacturing method of the quartz-crystal device 100.

FIG. 4 is a flow-chart showing the manufacturing method of the quartz-crystal device 100. In step S101, the quartz-crystal is lumbered. Lumbering is a technique in which a unit of synthetic quartz crystal is cut into conveniently sized units and the crystallographic axes of the units are clarified. The synthetic quartz-crystal 50 shown in FIG. 3 is a quartz-crystal after it is lumbered.

Step S111 to step S113 is a method for preparing the AT-cut quartz-crystal wafer. In step S111, an AT-cut quartz-crystal wafer 70 is lumbered with respect to X-axis direction to the Z-axis direction by 35°15'. This lumbering step yields AT-cut quartz-crystal wafer 70. FIG. 3 indicates the quartz-crystal wafer 70 lumbered from the synthetic quartz-crystal 50.

In step S112, the AT-cut quartz-crystal wafer 70 is etched to form an outline of the AT-cut frame 20. Step S112 defines outer shape of the outer frame 23 and AT-cut vibrating piece 22 by etching.

In step S113, electrodes are formed on the AT-cut frame 20. Excitation electrodes 21 and extraction electrodes 25 are formed by coating the AT-cut frame 20 by chromium Cr and gold Au.

Step S121 to S123 is a method for preparing the quartz-crystal wafer 80.

In step S121, quartz-crystal base wafer 80 is lumbered with respect to X-axis direction to the Z-axis direction by 31°58'±30'. This lumbering step yields quartz-crystal base wafer 80. FIG. 3 indicates the quartz-crystal base wafer 80 lumbered from the synthetic quartz-crystal 50.

In step S122, the quartz-crystal base wafer 80 is etched for forming the outline of the quartz-crystal base 30. In step S122, the recess 34 and the second surface 33 are formed on the quartz-crystal base wafer 80 by etching.

In step S123, the electrodes are formed on the quartz-crystal base wafer 80. A layer of chromium Cr and gold Au is coated on the quartz-crystal base wafer 80 for forming the external electrodes 31, connection electrodes 32 and conductor 35.

Step S131 to S132 is a method for preparing the quartz-crystal lid wafer 60.

In step S131, the quartz-crystal lid wafer 60 is lumbered in relative to the Z-axis direction at an angle between 24°00' or more and 32°28' or less. Manufacturing method of the quartz-crystal lid wafer 60 follows the same step as the quartz-crystal base wafer 80, and therefore the step S121 can be taken as step S131.

In step S132, the quartz-crystal lid wafer 60 is etched for forming the outline of the quartz-crystal lid 10. The recess 12 is formed by etching the quartz-crystal lid wafer 60.

The step for preparing the AT-cut quartz-crystal wafer, the step for preparing the quartz-crystal base wafer and the step for preparing the quartz-crystal lid wafer can be carried out in no particular order.

In step S141, AT-cut quartz-crystal wafer 70, the quartz-crystal base wafer 80 and quartz-crystal lid wafer are brought together and bonded. The bonding step is explained with reference to FIG. 5.

Figure 5:
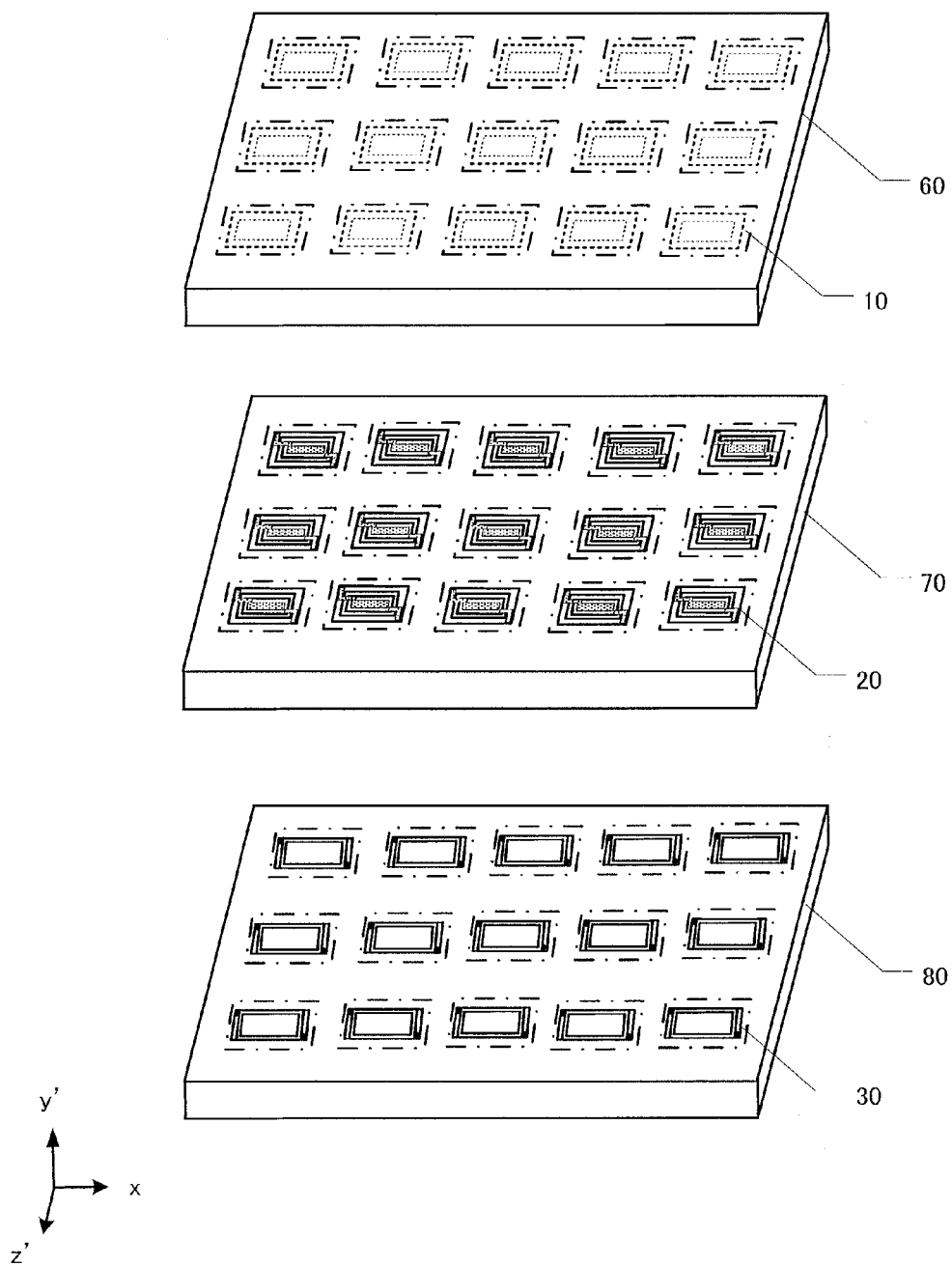
FIG. 5 shows the AT-cut quartz-crystal wafer 70, the quartz-crystal base wafer 80 and quartz-crystal lid wafer 60 before bonding.

FIG. 5 shows the AT-cut quartz-crystal wafer 70, the quartz-crystal base wafer 80 and quartz-crystal lid wafer 60 before bonding. On respective AT-cut quartz-crystal wafer 70, quartz-crystal base wafer 80 and quartz-crystal lid wafer 60, a plurality of AT-cut frame 20, quartz-crystal base 30 and quartz-crystal lid 10 are formed. Each wafer is stacked in the following order in +y'-axis direction; quartz-crystal lid wafer 60, AT-cut quartz-crystal wafer 70 and quartz-crystal base wafer 80. Alignment of each wafer is adjusted so that the quartz-crystal lid 10, AT-cut frame 20 and quartz-crystal base 30 are precisely stacked against each other.

Quartz-crystal device 100 can be brought together and bonded by siloxane bonding, since the quartz-crystal lid 10, the AT-cut frame 20 and the quartz-crystal base 30 are all fabricated by quartz-crystal. To form a siloxane bond, respective first and second principal surfaces, the first surface 11 and the second surface 33 of the outer frame 23, are mirror-finished and then irradiated by ultraviolet rays of a short wavelength in an oxygen-containing atmosphere to clean them. The cleaned bonding surfaces are co-aligned and brought into contact with each other in a vacuum or inert-gas atmosphere, in which they are subjected to compression and heating to a relatively low temperature of about 100° C. to 200° C., thus forming siloxane bonding between contacting surfaces. Alternatively to pretreatment by ultraviolet irradiation, other pretreatment methods are plasma-processing and ion-beam irradiation.

In step S142 of FIG. 4, sandwiched quartz-crystal device 100 is separated by cutting using a dicing unit such as a dicing saw. In separating step, each quartz-crystal devices 100 are cut into individual size.

Second Embodiment

<Overall Configuration of Quartz-Crystal Device 200>

In step S141 of FIG. 2, although wafers are brought together by siloxane bonding, each wafer can be brought together with sealing material. Quartz-crystal device 200, formed by bonding each wafers by sealing material is explained hereafter.

Figure 6A:
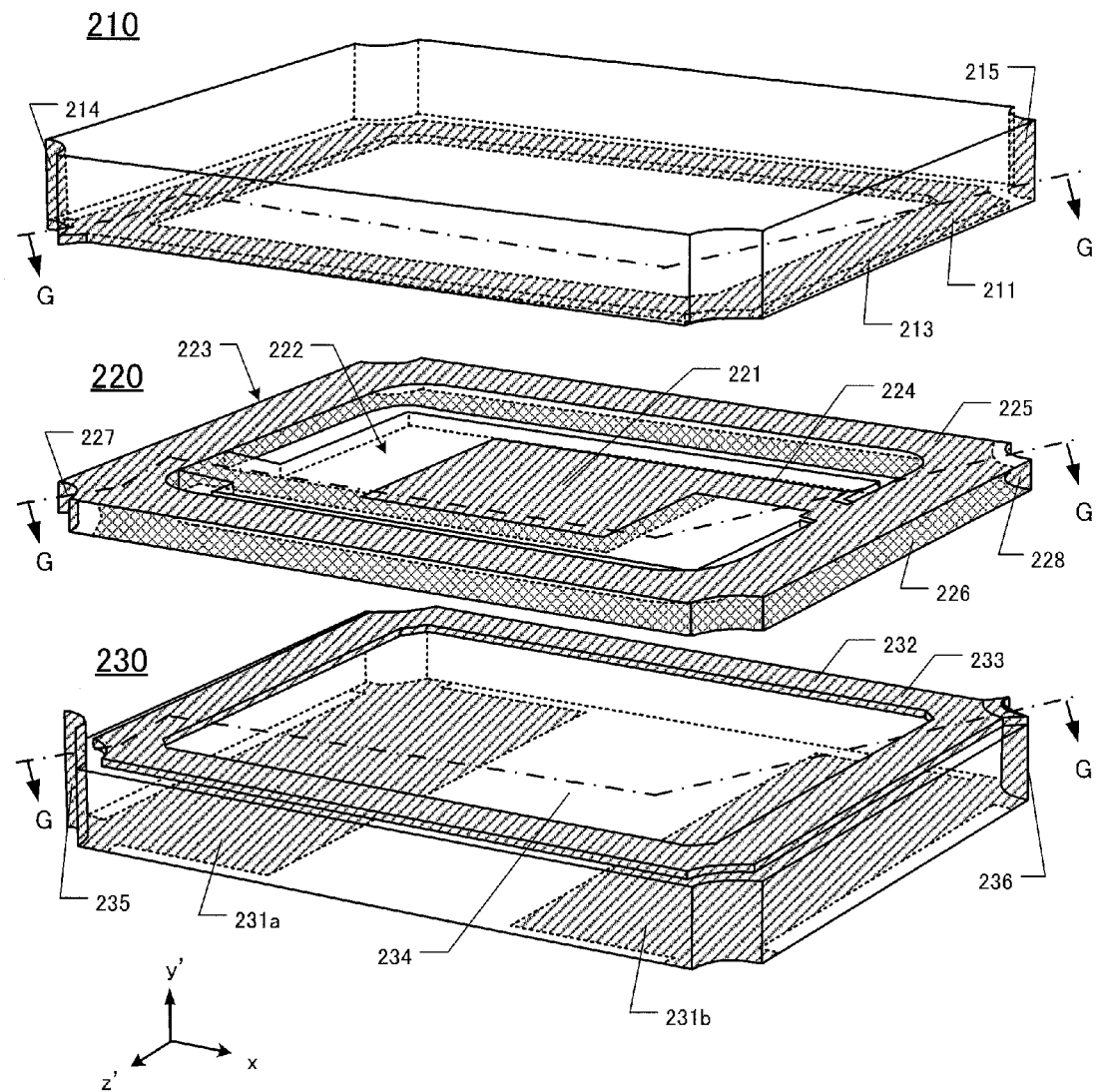
FIG. 6A is an exploded perspective view of the quartz-crystal device 200.

FIG. 6A is an exploded perspective view of the quartz-crystal device 200. Quartz-crystal device 200 is constituted of a quartz-crystal lid 210, a quartz-crystal base 230 and AT-cut frame 220 having an AT-cut vibrating piece 222 and an outer frame 223 for surrounding the AT-cut vibrating piece 222. The quartz-crystal lid 210 is disposed on +y'-axis side of the quartz-crystal device 200, and the quartz-crystal base 230 is disposed on −y'-axis side of the quartz-crystal device 200. The AT-cut frame 220 is disposed in a way that it is sandwiched between the quartz-crystal lid 210 and quartz-crystal base 230. In the quartz-crystal device 200, the quartz-crystal lid 210 and AT-cut frame 220 are bonded together by the sealing material 90, and the AT-cut frame 220 and quartz-crystal base 230 are bonded by the sealing material 90. The sealing material 90 is a eutectic metal made of gold tin or gold germanium.

On the quartz-crystal lid 210, the first surface 211, formed on the −z-axis side, is bonded to the second surface 223 of the outer frame of the AT-cut frame 220. On the first surface 211, a band of metal ring 213 is formed. The castellations are formed on four respective corners of the quartz-crystal lid 210. On the first castellation 214, a metal film is formed, which is electrically connected to the metal ring 213. Also, a metal film is formed on the sixth castellation 215; however, the metal film on the sixth castellation 215 is not electrically connected to the metal ring 213.

The AT-cut frame 220 is constituted of the AT-cut vibrating piece 222 and outer frame 223. A pair of excitation electrodes 221 are formed on respective first principal surface of the AT-cut vibrating piece 222 in +y'-axis direction, and the second principal surface in −y'-axis direction. The metal ring 225 and 226 are formed on respective first principal surface and second principal surface of the outer frame 223, which is electrically connected to the extraction electrode 224 and excitation electrode 221. The metal films are formed in respective second castellation 227 and third castellation 228. The metal film formed on the second castellation 227 is electrically connected to the metal ring 225 formed on the first principal surface, and not electrically connected to the metal ring 226 formed on the second principal surface. The metal film formed on the third castellation 228 is electrically connected to the metal ring 226 formed on the second principal surface, and not electrically connected to the metal ring 225 formed on the first principal surface.

On the quartz-crystal base 230, the second surface 233, formed on +y'-axis side of the quartz-crystal base 230, is bonded to the outer frame 223 of the AT-cut frame 220. Also, a recess 234 is formed inside of the second surface 233. An external electrode 231a and 231b are formed on the quartz-crystal base in −y'-axis direction, and a metal ring 232 is formed on the second surface 233. The castellations are formed in periphery of four respective corners of the quartz-crystal base 230. The metal films are formed on the fourth castellation 235 and fifth castellation 236. The metal film formed on the fourth castellation 235 is electrically connected to the external electrode 231a, but not connected to the metal ring 232. The metal film formed on the fifth castellation 236 is electrically connected to the external electrode 231b and the metal ring 232.

Figure 6B:
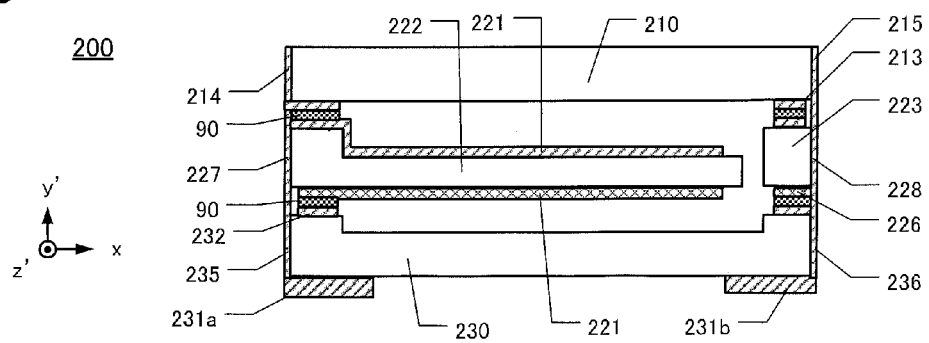
FIG. 6B is a cross-sectional view of FIG. 6A taken along G-G line.

FIG. 6B is a cross-sectional view of the FIG. 6A taken along G-G line. In the quartz-crystal device 200, the sealing material 90 is formed between the quartz-crystal lid 210 and AT-cut frame 220, and between the AT-cut frame 220 and quartz-crystal base 230. The quartz-crystal device 200 is disposed in a way that the first castellation 214 of the quartz-crystal lid 210, the second castellation 227 of the outer frame 223 on the AT-cut frame 220, and the fourth castellation 235 of the quartz-crystal base 230 are precisely stacked. Also, the quartz-crystal device 200 is disposed in a way that the sixth castellation 215 of the quartz-crystal lid 210, the third castellation 228 of the outer frame 223 on AT-cut frame 220, and the fifth castellation 236 of the quartz-crystal base 230 are precisely stacked.

The metal films formed on the first castellation 214, second castellation 227 and fourth castellation 235 are all electrically connected. Also, the metal films formed on the sixth castellation 215, third castellation 228 and fifth castellation 236 are all electrically connected. Therefore, the excitation electrode 221 and external electrode 231a, formed on the first principal surface of the AT-cut vibrating piece 222, are electrically connected, and the excitation electrode 221 and external electrode 231b, formed on the second principal surface of the AT-cut vibrating piece 222 are electrically connected. The metal film on the sixth castellation 215 is not used as an electrode.

The manufacturing method of the quartz-crystal device 200 is basically similar to the manufacturing method of the quartz-crystal device 100. Thereby, with exception of a few steps, the manufacturing method for the quartz-crystal device 200 follows the same step as flow-chart in FIG. 4.

In the quartz-crystal device 100, the metal film is not formed on the quartz-crystal lid 10; therefore, an additional step for forming the band of metal ring is necessary, in order to form the metal film. Also, the second quartz-crystal device 200 is bonded by sealing material 90 made of eutectic material, instead of siloxane bonding.

In the quartz-crystal device 200, after step S132 of FIG. 4, an electrode is formed on the quartz-crystal lid wafer.

As mentioned above, although optimal embodiments of the present disclosure were explained in detail, it will be understood by a person skilled in the art that the disclosure encompasses various alterations and modifications to the embodiments, within the technical scope of the disclosure. For example, the metal ring 213 is not necessary to be formed on the quartz-crystal lid 210 of the quartz-crystal device 200. In such case, instead of using the sealing material 90 made by eutectic metal, adhesive made by material such as, low-melting-point glass, epoxy resin or polyimide resin, is used.

What is claimed is:

1. A method for manufacturing a quartz-crystal device, comprising the steps of:
preparing an AT-cut quartz-crystal wafer including a plurality of frames, the frame having an AT-cut vibrating piece having a first principal surface and a second principal surface, and an outer frame which surrounds the AT-cut vibrating piece for supporting the AT-cut vibrating piece thereof;
preparing a quartz-crystal lid wafer having a plurality of lids having a first surface, which is bonded to the first principal surface of the outer frame;
preparing a quartz-crystal base wafer having a plurality of bases having a second surface, which is bonded to the second principal surface of the outer frame; and
bonding the AT-cut quartz-crystal wafer, the quartz-crystal base wafer and the quartz-crystal lid wafer;
wherein the respective AT-cut quartz-crystal wafer, the quartz-crystal base wafer and the quartz-crystal lid wafer are in a size between three to four inches, and during the preparing steps, the quartz-crystal base wafer and the quartz-crystal lid wafer are cut at an angle between 24°00' or more and 32°28' or less from crystallographic Z-axis.

2. The method for manufacturing the quartz-crystal device of claim 1, wherein during the bonding step, a method for bonding by a sealing material or a siloxane bonding is used, the method for bonding by a sealing material includes applying the sealing material onto the first principal surface of the outer frame and the first surface, and applying the sealing material onto the second principal surface of the outer frame and the second surface, and wherein the bonding step by siloxane bonding includes the bonding by activating the first surface and the second surface for siloxane bonding.

3. The method for manufacturing the quartz-crystal device of claim 2, wherein the sealing material comprises an adhesive made of epoxy resin, eutectic metal or polyimide resin.

4. A quartz-crystal device, comprising:
an AT-cut frame having an AT-cut vibrating piece having a pair of an excitation electrode formed on a first principal surface and an second principal surface, and an AT-cut frame having an outer frame for surrounding the AT-cut vibrating piece;

a quartz-crystal lid having a first surface to be bonded onto the first principal surface of the outer frame; and a quartz-crystal base having a second surface to be bonded on the second principal surface of the outer frame;

wherein the quartz-crystal base and the quartz-crystal lid are cut at an angle between 24°00' or more and 32°28' or less from crystallographic Z-axis.

5. The quartz-crystal device of claim 4, wherein the quartz-crystal lid, the quartz-crystal base and the AT-cut frame have the same respective X-axis direction.

6. The quartz-crystal device of claim 4, wherein the sealing material is disposed between the first principal surface of the outer frame and the first surface, and between the second principal surface of the outer frame and the second surface.

7. The quartz-crystal device of claim 5, wherein the sealing material is disposed between the first principal surface of the outer frame and the first surface, and between the second principal surface of the outer frame and the second surface.

8. The quartz-crystal device of claim 4, wherein the first principal surface of the outer frame and the first surface and between the second principal surface of the outer frame and the second surface are activated and bonded by siloxane bonding.

9. The quartz-crystal device of claim 5, wherein the first principal surface of the outer frame and the first surface and between the second principal surface of the outer frame and the second surface are activated and bonded by siloxane bonding.

10. The quartz-crystal device of claim 4, wherein a castellation is formed on the periphery of the outer frame, the periphery is defined by viewing from the first principal surface to the second principal surface.

11. The quartz-crystal device of claim 5, wherein a castellation is formed on the periphery of the outer frame, the periphery is defined by viewing from the first principal surface to the second principal surface.

12. The quartz-crystal device of claim 6, wherein a castellation is formed on the periphery of the outer frame, the periphery is defined by viewing from the first principal surface to the second principal surface.

* * * * *